United States Patent
Pandel et al.

(10) Patent No.: US 7,613,163 B2
(45) Date of Patent: Nov. 3, 2009

(54) METHOD FOR TRANSMISSION OF DIGITAL INFORMATION PACKETS IN A DATA NETWORK

(75) Inventors: Jürgen Pandel, Feldkirchen-Westerham (DE); Marcel Wagner, München (DE)

(73) Assignee: Siemens Aktiengesellschaft, Munich (DE)

( * ) Notice: Subject to any disclaimer, the term of this patent is extended or adjusted under 35 U.S.C. 154(b) by 512 days.

(21) Appl. No.: 10/579,992

(22) PCT Filed: Nov. 17, 2004

(86) PCT No.: PCT/EP2004/052996

§ 371 (c)(1),
(2), (4) Date: May 19, 2006

(87) PCT Pub. No.: WO2005/050901

PCT Pub. Date: Jun. 2, 2005

(65) Prior Publication Data

US 2007/0064707 A1   Mar. 22, 2007

(30) Foreign Application Priority Data

Nov. 19, 2003   (DE) ................. 103 53 974

(51) Int. Cl.
*H04J 3/24* (2006.01)
*H04L 12/28* (2006.01)
*G01R 31/28* (2006.01)
(52) U.S. Cl. .................. 370/349; 370/394; 714/784
(58) Field of Classification Search ............ 714/784, 714/786; 370/394, 349
See application file for complete search history.

(56) References Cited

U.S. PATENT DOCUMENTS 6,487,690 B1 * 11/2002 Schuster et al. ............ 714/752

(Continued)

FOREIGN PATENT DOCUMENTS

EP     1 014 730 A1    6/2000

OTHER PUBLICATIONS

Jill M. Boyce, "Packet loss resilient transmission of MPEG video over the Internet", Signal Processing: Image Communication, Elsevier Science Publishers, Amsterdam, NL, Sep. 1999, vol. 15, No. 1-2, pp. 7-24, XP004180635.

*Primary Examiner*—Alpus H Hsu
*Assistant Examiner*—Jessica Clifton

(57) ABSTRACT

The invention relates to a method for transmitting digital information packets in a data network from an emitter to a receiver, the information packets being transported by means of a transport layer. Said method is characterized by the following steps: the information packets to be transmitted are divided into at least two data packet groups in the emitter; redundancy information is respectively added to the data packet groups in the form of redundancy packets; the information packets and the redundancy packets in the data packet groups are respectively completed with a signalization field containing information used to determine the position of the respective information packet or the respective redundancy packet inside the respective data packet group; the data packet groups are transmitted to the receiver; the signalization fields of the information packets and redundancy packets received are read out in the receiver, and the positions of the information packets and the redundancy packets are reconstructed in the data packet groups by means of the information in the signalization fields.

13 Claims, 3 Drawing Sheets

U.S. PATENT DOCUMENTS

| | | | |
|---|---|---|---|
| 2002/0080802 A1* | 6/2002 | Sachs et al. | 370/401 |
| 2002/0141338 A1* | 10/2002 | Burke | 370/229 |
| 2003/0005387 A1* | 1/2003 | Tsunoda | 714/785 |
| 2003/0031198 A1* | 2/2003 | Currivan et al. | 370/465 |
| 2003/0207696 A1* | 11/2003 | Willenegger et al. | 455/522 |

* cited by examiner

METHOD FOR TRANSMISSION OF DIGITAL INFORMATION PACKETS IN A DATA NETWORK

CROSS REFERENCE TO RELATED APPLICATIONS

This application is the US National Stage of International Application No. PCT/EP2004/052996, filed Nov. 17, 2004 and claims the benefit thereof. The International Application claims the benefits of German application No. 10353974.3 DE filed Nov. 19, 2003, both of the applications are incorporated by reference herein in their entirety.

FIELD OF INVENTION

The invention relates to a method for transmission of digital information packets in a data network from an emitter to a receiver, as well as to a corresponding emitter and a corresponding receiver.

BACKGROUND OF INVENTION

In digital data transmission the problem occurs of data being lost during transmission as a result of bad transmission connections or low bandwidths. With packet-oriented data traffic in particular, incorrect or lost data leads to a loss of complete packets, in which case the content is no longer able to be reproduced correctly. Especially problematic is the loss of data with so-called multimedia applications, in which the data is often to be displayed in real time without delay at the receiver.

What are referred to as broadcast and multicast transmissions are known from the prior art in which data is sent from a single emitter and can be received by a plurality of receivers. What are known as Reed-Solomon codes can be used for error protection in these data transmissions. Redundancy is inserted into the data with the aid of the Reed-Solomon codes, so that if the data losses at the receiver are not too great the original data can be reconstructed. Known error protection methods employing Reed-Solomon codes are suitable for example for the terrestrial data transmission in accordance with the DVB-T (DVB-T=Digital Video Broadcast—Terrestrial) standard and with the compatible DVB-H (Digital Video Broadcast—Handheld) standard. However problems arise when using other data transmission mechanisms. The use of the future Multimedia Broadcast/Multicast Service (MBMS), in which a broadcast data transmission over mobile radio channels is made possible, is especially problematic, since for a data transmission to a mobile receiver there is no guarantee of the data packets arriving at the receiver in the sequence in which they were sent by the emitter.

SUMMARY OF INVENTION

An object of the invention is therefore to create a method for transmission of digital Information packets from an emitter to a receiver which enables broadcast and multicast data transmission for a plurality of transmission networks.

This object is achieved by the independent claims. Developments of the invention are defined in the dependent claims.

In the inventive transmission method digital information packets are sent from an emitter to a receiver, with the information packets being transported by means of a transport layer. Transport layer in this case is to be understood as a transport layer in the sense of the OSI (OSI=Open Systems Interconnection) reference model. In the method the information packets to be transmitted are divided up in a first step in the emitter into one or more data packet groups. Redundant information in the form of redundancy packets is then inserted into the data packet groups. Subsequently the information packets and the redundancy packets are each supplemented by a signalisation field in data packet groups, in which information is stored with which the position of the relevant information packet or of the relevant redundancy packet within the data packet group can be determined. The data packet groups are then transmitted to the receiver and in the receiver the signalisation fields of the information packets and redundancy packets received are read out. Finally, with the aid of the information in the signalisation fields, the positions of information packets and redundancy packets in the relevant data packet groups are reconstructed. The idea of the invention is based on supplementing the information packets or redundancy packets to be transmitted by a signalisation field with which the correct positioning of the individual packets in the data packet groups at the recipient is guaranteed. The method is thus suitable also for transmission over data networks in which data packets do not arrive at the receiver in the order in which they were sent from the emitter.

In a preferred embodiment of the invention the information as to whether an information packet or a redundancy packet is present is contained in the signalisation fields in each case. Furthermore the information about the data packet group to which the respective information packet or redundancy packet belongs is preferably contained in the signalisation fields. This information is especially important if large data packet losses occur so that entire packet groups are lost. In a further preferred embodiment of the invention the signalisation fields further contain the information as to whether the relevant information packet or redundancy packet is the last information packet or redundancy packet in the data packet group concerned. With the aid of this information, in combination with further information in the signalisation field the size of the data packet group can be derived, without parameters relating to this variable having to be transferred directly.

In an especially preferred embodiment of the invention the data packet groups concerned are a data matrix with a plurality of data fields in a plurality of rows and columns in each case. The data fields are preferably octets, i.e. 8-bit fields in this case.

If the data packet groups are arranged in the form of data matrixes the information packets and/or the redundancy packets in the signalisation field preferably contain the column and/or line address of the relevant information packet or redundancy packet in the data matrix. The position of the first data field of the corresponding data packet in the data matrix is specified by this address. Preferably the redundancy packets each occupy a row in the corresponding data matrix so that it is no longer necessary for the redundancy packets to transmit column addresses.

In a further embodiment of the invention the row length of the data matrix is reconstructed from the length of a correctly received redundancy packet. Furthermore one or more signalisation fields can each contained two parameters selected from the set of parameters comprising the relevant redundancy packet number, the row address of the relevant redundancy packet and the number of rows in which information packets are contained, and with the aid of the two parameters in the signalisation field the parameter of the parameter set can be determined which is not contained in the signalisation field. In addition the number of rows of the data matrix which are needed at the recipient for received redundancy packets can be reconstructed with the aid of the correctly received redundancy packet with the highest redundancy packet number and its row address.

In a further preferred embodiment the previously known Reed-Solomon codes are used for generating the redundancy packets. Furthermore the signalisation fields are preferably 24-bit fields.

In a further embodiment of the inventive method the receiver waits after receiving the last information packet and the last redundancy packet of a data packet group for a predetermined interval for information packets or redundancy packets of the data packet group which are still missing. This achieves an effective reconstruction especially in cases in which the data packets arrive partly delayed at the recipient.

The inventive method is especially suitable for use in a mobile radio network. In mobile radio networks the data is transmitted in the physical layer using various bearer services which leads to different data delays so that the data packets are no longer absolutely necessarily received in the correct order. Through the use of a signalisation field in accordance with the invention a reconstruction of the data packet can be guaranteed even in such cases.

As well as the inventive transmission method, the invention further relates to an emitter for sending digital information packets which is able to be used in the inventive transmission method. The emitter is designed to enable it to execute the following method steps:

The information packets to be transmitted are divided up into one or more data packet groups;

Redundancy information in the form of redundancy packets is added to the data packet groups in each case;

The information packets and the redundancy packets in the data packet groups are each expanded by a signalisation field in which information is stored with which the position of the relevant information packet or of the relevant redundancy packet within the relevant data packet group can be determined;

The data packet groups are sent to a recipient.

The invention also relates to a receiver for receiving digital information packets with the aid of the inventive transmission method, with the receiver being embodied such that it is able to execute the following method steps:

The information packets and redundancy packets sent by an emitter are received;

The signalisation fields of the received information packets and redundancy packets are read out, and with the aid of the information in the signalisation fields, the positions of the information packets and redundancy packets in the relevant data packet groups are reconstructed.

BRIEF DESCRIPTION OF THE DRAWINGS

Exemplary embodiments of the invention will now be described with reference to the enclosed drawings.

The figures show.

DETAILED DESCRIPTION OF INVENTION

Figure 1:
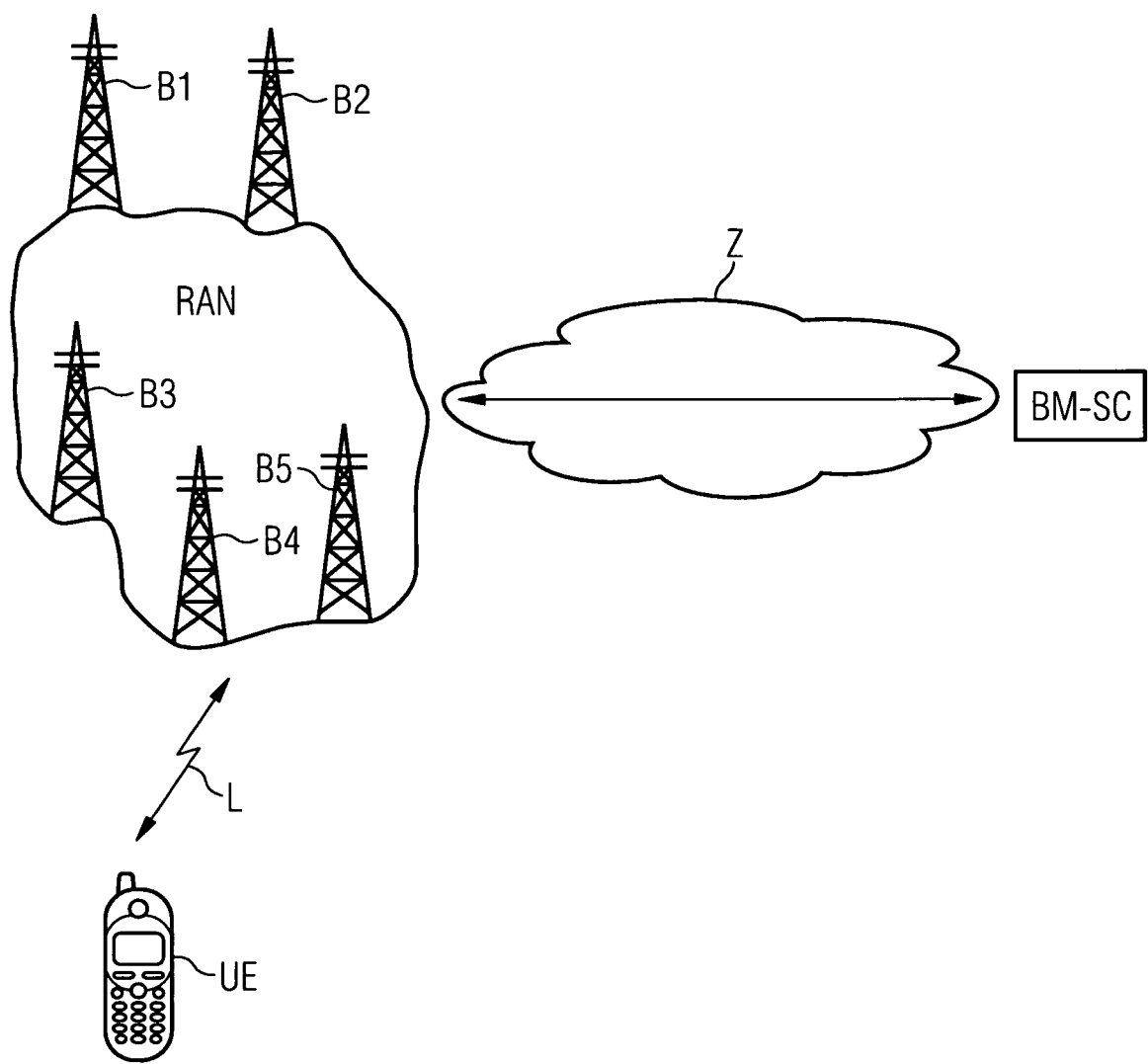
FIG. 1 the schematic diagram of a data network in which the inventive method is used.

FIG. 1 shows a preferred scenario in which the method in accordance with invention can be used. This scenario involves the transmission of multimedia data of a broadcast service which sends out data which can be received simultaneously by a number of receivers. The multimedia data is provided by a Broadcast Multicast Service Center BMSC and is transmitted over any given intermediate network Z to a mobile radio network RAN (RAN=Radio Access Network). The mobile radio network RAN comprises a plurality of base stations B1 to B5, by means of which the multimedia data is sent to user equipment (UE) in the form of a mobile telephone over an air interface L.

The BMSC creates information packets which comprise a header and a payload, in which case the information packets are data packets which are transmitted with the aid of a transport layer in accordance with the OSI reference model. The scenario shown in FIG. 1 differs from the broadcast service DVBT in that on the one hand data transmission takes place over a mobile radio network and on the other hand the data transport is undertaken in packets via the transport layer. For the transmission over the air interface L the problem arises that for data transport over a number of different mobile radio channels, the data no longer necessarily arrives in the same order as it was sent from the base station. Furthermore data packet losses occur on the various mobile radio channels. This makes a reconstruction of the information sent to the user equipment UE extremely difficult.

To solve this problem it is proposed in accordance with the invention to add redundancy information to the information packets as well as to supplement the data packets with a signalisation field, in which case the signalisation field makes it possible to reconstruct the received information packets in the correct order.

Figure 2:
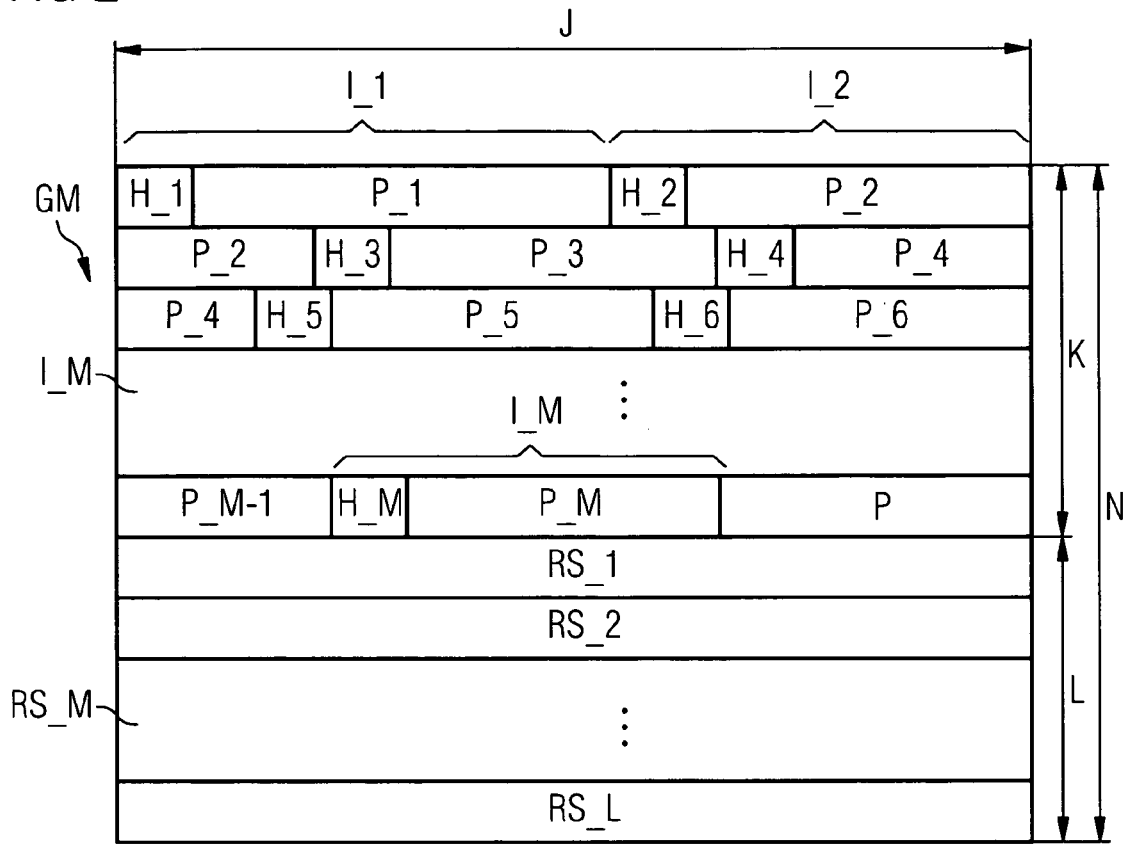
FIG. 2 the data matrix used in an embodiment of the inventive method.

FIG. 2 shows a data matrix in which the data packets in accordance with an embodiment of the invention are arranged at the emitter. The data to be transmitted is initially segmented into information packets I_1, I_2, . . . I_M, with this segmentation able to be undertaken by suitable protocols at different protocol layers such as RTP/UDP/IP for example (RTP=Real Time Protocol; UDP=User Datagram Protocol; IP=Internet Protocol). The individual information packets for I_1 to I_M in this case each comprise header H_1, H_2, . . . , H_M as well as payload P_1, P_2, . . . , P_M.

The data packets I_1 to I_M are finally arranged in a media data matrix I-M which contains K rows and J columns. The individual entries of the matrix are in this case data fields consisting of 8-bit symbols. Since the data packets contained in the matrix I-M cannot always be mapped exactly to the size of the matrix, the matrix is filled after the last information packet I_M which still fits into matrix with what is known as padding P. Preferably the padding field is filled with zeros.

After the arrangement of the information packets in the matrix I-M the information packets are occupied by redundant data. This is done column-by-column by inserting what on known as Reed-Solomon codes which are sufficiently known to the person skilled in the art. In the embodiment described here Reed-Solomon codes are used via Galois fields $GF(2^8)$. In accordance with the embodiment of FIG. 2 L rows of Reed-Solomon codes are created in the form of redundancy packets RS_1, RS_2, . . . RS_L which are arranged in the matrix RS-M. In this way an overall matrix GM is produced, featuring a total of N=K+L rows.

The Reed-Solomon codes used are what are known as (N,K) codes with which the original can be reconstructed up to a loss of N-K symbols. Reed-Solomon codes are systematic codes, with which both symbol errors and also symbol losses can be detected, with the position of the loss having to be known in the latter case. If there are r symbol losses and s symbol errors in a data matrix, all packets can be reconstructed for which the following applies:

$$2s=r\leq L.$$

Figure 3:
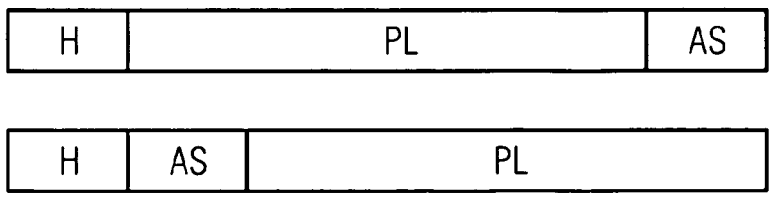
FIG. 3 the schematic diagram of two types of data packet able to be used in the inventive method.

In accordance with the inventive method the information packets and the redundancy packets of the data matrix GM are also provided with a signalisation field. FIG. 3 shows the locations at which such a signalisation field can be arranged in an information packet. Two alternatives are shown in FIG. 3, with the signaling packet AS being arranged in the upper alternative after the header H and the payload PL of the information packet. Alternatively, a variant is shown in the lower information packet of FIG. 2 in which the signalisation field AS is arranged between the header H and the payload PL. however other positions of the signalisation field are possible in the information packet. The signalisation field can be arranged in the redundancy packets in the same way since these packets also feature a header and a payload.

Figure 4:
FIG. 4 the layout of a signalisation field for an information packet used in the inventive method.

The way in which the signalisation field AS can be structured for an Information packet in accordance with one embodiment of the invention is shown in FIG. 4. The AS field is a 24-bit field, with the first five bits containing signalisation information, labeled as "signaling" in FIG. 4. The first bit of this 5-bit field is a data type flag which shows whether the corresponding packet is an Information packet or a redundancy packet. If it is an information packet, the flag is set to 0, if there is a redundancy packet present, the flag is set to 1. The second bit of the 5-bit field is a flag which indicates whether the current data packet is the last packet in the data matrix. If it is, the flag is set to 1. The remaining three bits in the 5-bit field contain a modulo-8 matrix counter. This counter is incremented if the data packets of a new matrix are transmitted. The counter thus shows the data matrix from which the corresponding information packet originates. The counter is helpful if large data packet losses occur over a number of data matrices, since in this case the data matrix to which the received information packet belongs can still be established. An 11-bit field with which the column address of the relevant information packet is transferred follows the 5-bit field. This field is labeled "column address" in FIG. 4. The column address in this case specifies the column position of the first symbol of the corresponding packet in the matrix I-M. The field "column address" is followed by the field "row address" which is an 8-bit field and specifies the row position of the first symbol of the relevant information packet in the matrix GM.

Figure 5:
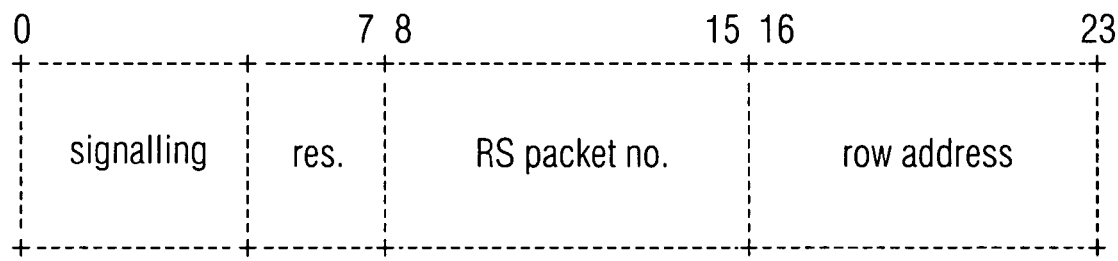
FIG. 5 the layout of a signalisation field for a redundancy packet used in inventive method.

FIG. 5 shows the layout of the signalisation field for a redundancy packet. This field is again a 24-bit field, with, in a similar way to the signalisation field in the information packets, a field "signaling" being used which contains the data type flag, a flag for displaying the last redundancy packet in the matrix RS-M as well as a modulo-8 matrix counter. The function of this field thus corresponds to the function of the field in FIG. 4. This field is followed by the field "res." which represents a reservation field and is not needed for signaling. The field "RS packet no." follows between bit 8 and 15, which contains the sequence number of the redundancy packet within the matrix RS-M. This field is helpful where packet losses occur between the matrix I-M and the matrix RS-M, i.e. if the first and where necessary further redundancy packets of the matrix RS-M are lost. In this case the sequence can be used to determine the row in which the matrix RS-M begins. The field "row address" follows the field "RS packet no." which is an 8-bit field and indicates the position of the first symbol of the corresponding redundancy packet in the matrix GM. By contrast with the AS field for the information packets, the information as to the column address at which the packet is located does not have to be transferred in the AS field for the redundancy packets, since each redundancy packet in the embodiment described here always occupies a whole row.

After the creation of the data matrix in accordance with FIG. 2 at the emitter the information packets and the redundancy packets are transmitted to the receiver. In the event of packet losses, the information packets can be reconstructed there with the aid of the redundancy packets as follows:

For reconstruction the row length J as well as the number of columns K of the matrix I-M must be known. Since the redundancy data packets always occupy a whole row, the parameter J can be derived from the packet length of the individual redundancy packets. The parameter K can in its turn be derived from the row address and the packet number of one of the correctly received redundancy packets.

The parameter L, which specifies the number of rows of the matrix RS-M, also does not have to be transmitted to the receiver. It can either be derived from the row address of the last redundancy packet or it is replaced by a smaller value L' which corresponds to the row of the last redundancy packet received.

In the receiver the correctly received information packets and redundancy packets are analyzed, with the information packets being positioned with the aid of the row and column address as well as the matrix counter in the AS field to the correct position in the data matrix. Subsequently the signalisation fields are cut out of the information packets and the packet length parameters in the headers of the information packets are issued. In addition the checksum field of the header is recalculated. The process is similar for the redundancy packet method, with the header of this packet being removed completely. If packets are lost during transmission, the corresponding entries are marked in the data matrix GM as losses. A data matrix can in this case be completely restored again if the number of symbol losses per column is not greater than L.

A further problem for the reconstruction of the data matrix at the receiver thus results from the fact that the receiver does not initially know whether a missing data packet has been lost or whether it is delayed in time because of different transmission procedures via different bearer services in the mobile radio network. To counter this problem, in accordance with the embodiment of the inventive method described here, after the receipt of the last information packet and the receipt of the last redundancy packet, there is a predetermined wait time before processing of the data matrix is continued. Thus data packets arriving after a delay at the receiver are also taken into account in the data matrix. Should the last information packet in the data matrix should have been lost however, the receiver has no opportunity of finding out how large the padding P in the matrix I-M is since the size of the last data packet is not known. In this case all symbols after the last correctly received information data packet must be marked up to the end of column K as data packet losses, although padding can also be contained in this area.

The invention claimed is:

1. A method for transmission of digital information packets in a data network from an emitter to a receiver, the information packets transported via a transport layer, the method comprising:

in the emitter, forming one or more data packet groups, each data packet group comprising information packets to be transmitted;

for each data packet group:

inserting redundancy packets into the data packet group;

for each information packet in the data packet group, inserting a first signalization field comprising an information packet position field that provides a position of the corresponding information packet in the data packet group, an indicator identifying a data packet group to which each information packet belongs, and a one-bit flag indicating if the corresponding information packet is the last information packet in the data packet group;

for each redundancy packet in the data packet group, inserting a second signalization field comprising a redundancy-packet position field that provides a position of the corresponding redundancy packet in the data packet group. an indicator identifying a data packet group to which each redundancy packet belongs, and a one-bit flag indicating if the corresponding redundancy packet is the last redundancy packet in the data packet group;

transmitting the data packet group to the receiver;

receiving the data packet group by the receiver;

waiting a predetermined time after receiving a last information packet and a last redundancy packet; and after the predetermined time, reconstructing the data packet group at the receiver by using information in the first and the second signalization fields to determine whether a received information packet or a received redundancy packet belongs to the data packet group, to determine the positions of the information and redundancy packets in the data packet group and configuring the data packet group with a row length equal to a length of a correctly received redundancy packet, wherein within a reconstructed data packet group the information packets may span more than one row, and wherein a size of the data packet group can be determined from information in the first and the second signalization fields and the length of a correctly received redundancy packet.

2. The method according to claim 1, wherein the first and second signalization fields comprise a type flag that indicates if the respective packet is an information packet or a redundancy packet.

3. The method according to claim 1, wherein each data packet group is arranged according to a data matrix comprising a plurality of data fields in a plurality of rows for the information packets, a plurality of rows for the redundancy packets, and a plurality of columns for information and redundancy packets.

4. The method according to claim 3, wherein the data fields are 8-bit fields.

5. The method according to claim 3, wherein the information-packet position field includes the data matrix column of the information packet.

6. The method according to claim 3, wherein the information-packet position field includes the data matrix row of the information packet.

7. The method according to claim 3, wherein each redundancy packet occupies one data matrix row.

8. The method according to claim 3,
wherein the second signalization field comprising two parameters selected from the group consisting of a packet number, a row position, and a number of rows, wherein the packet number is a number of the redundancy packet relative to other redundancy packets in the respective data packet group, wherein the row position indicates the redundancy packet position, and wherein the number of rows is the number of rows occupied by the information packets in the data matrix, wherein the two parameters permit reconstruction of the data packet group.

9. The method according to claim 8, wherein the number of rows is used by the receiver to reconstruct the data packet group.

10. The method according to claim 1, wherein the redundancy packets comprise Reed-Solomon codes.

11. The method according to claim 1, wherein the first and second signalization fields are 24-bit fields.

12. The method according to claim 1, wherein the data network comprises a mobile radio network.

13. A method for enabling a receiver to receive digital information packets, comprising:

receiving a data packet group by the receiver, the data packet group having a plurality of information packets and a plurality of redundancy packets, each information packet group including a first signalization field comprising an information packet position field that provides a position of the information packet in the corresponding data packet group, an indicator identifying a data packet group to which each information packet belongs, and a one-bit flag indicating if the corresponding information packet is the last information packet in the data packet group;

each redundancy packet including a second signalization field comprising a redundancy-packet position field that provides a position of the corresponding redundancy packet in the data packet group. an indicator identifying a data packet group to which each redundancy packet belongs, and a one-bit flag last indicator that indicates indicating if the corresponding redundancy packet is the last redundancy packet in the data packet group;

waiting a predetermined time after receiving a last information packet and a last redundancy packet; and after the predetermined time, reconstructing the data packet group using the information in the first and the second signalization fields to determine whether a received information packet or a received redundancy packet belongs to the data packet group, to determine the positions of the information and redundancy packets in the data packet group and configuring the data packet group with a row length equal to a length of a correctly received redundancy packet, wherein within a reconstructed data packet group the information packets may span more than one row, and wherein a size of the data packet group can be determined from information in the first and the second signalization fields and the length of a correctly received redundancy packet.

* * * * *

UNITED STATES PATENT AND TRADEMARK OFFICE
CERTIFICATE OF CORRECTION

PATENT NO.      : 7,613,163 B2
APPLICATION NO. : 10/579992
DATED           : November 3, 2009
INVENTOR(S)     : Pandel et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 680 days.

Signed and Sealed this

Nineteenth Day of October, 2010

David J. Kappos
*Director of the United States Patent and Trademark Office*